United States Patent [19]

Hong et al.

[11] Patent Number: 5,494,839
[45] Date of Patent: Feb. 27, 1996

[54] DUAL PHOTO-RESIST PROCESS FOR FABRICATING HIGH DENSITY DRAM

[75] Inventors: Gary Hong; Chen-Chiu Hsue, both of Hsin-Chu, Taiwan

[73] Assignee: United Microelectronics Corporation, Hsin-Chu, Taiwan

[21] Appl. No.: 237,352

[22] Filed: May 3, 1994

[51] Int. Cl.$^6$ .............................................. H01L 21/8242
[52] U.S. Cl. ........................ 437/52; 437/60; 437/919; 437/229
[58] Field of Search ................................ 437/47, 48, 52, 437/60, 228, 229, 919; 257/306, 308, 309; 156/659.1

[56] References Cited

U.S. PATENT DOCUMENTS

| | | | |
|---|---|---|---|
| 4,088,490 | 5/1978 | Duke et al. | 437/228 |
| 4,767,723 | 8/1988 | Hinsberg, III et al. | 437/229 |
| 4,838,991 | 6/1989 | Cote et al. | 156/659.1 |
| 5,023,203 | 6/1991 | Choi | 437/229 |
| 5,173,437 | 12/1992 | Chi | 437/229 |
| 5,296,410 | 3/1994 | Yang | 437/229 |
| 5,306,658 | 4/1994 | Gill | 437/229 |

FOREIGN PATENT DOCUMENTS 0193544  11/1983  Japan .

*Primary Examiner*—Tom Thomas
*Attorney, Agent, or Firm*—Meltzer, Lippe et al.

[57] ABSTRACT

A dual photo-resist process for fabricating capacitor plates of a DRAM is disclosed including the step of forming a capacitor on a semiconductor IC surface. A first plurality of photo-resist regions which are separated from each other by spaces are then formed on the capacitor plate layer. At least one second photo-resist region is then formed on the capacitor plate layer which partially fills a space between, and is adjacent to one of, two of the first photo-resist regions. The capacitor plate layer is then etched below the spaces between the first and second photo-resist regions to form a plurality of individual capacitor plates including one capacitor plate for each DRAM cell.

8 Claims, 2 Drawing Sheets

5,494,839

DUAL PHOTO-RESIST PROCESS FOR FABRICATING HIGH DENSITY DRAM

FIELD OF THE INVENTION

The present invention relates to a process for fabricating closely spaced capacitor plates in a high density DRAM process using two photo-resist regions formed adjacent to each other.

BACKGROUND OF THE INVENTION

A DRAM cell typically includes a MOS transistor and a capacitor. An example of such a DRAM cell is shown in FIG. 1. The DRAM cell 10 of FIG. 1 has a MOSFET 12 and a capacitor 14. A word line is connected to the gate of the MOSFET 12. A bit line is connected to the source of the MOSFET 12. The capacitor 14 is connected to the drain of the MOSFET 12. The logic state of the DRAM cell is determined by whether or not the capacitor 14 is holding a charge.

The DRAM cell 10 is read by using the bit line to determine whether or not a charge is stored in the capacitor 14. The DRAM cell 10 is written by using the bit line to add or remove charge from the capacitor 14. However, the cell can only be read or written when the cell 10 is addressed (i.e., activated) by the word line.

It is an object of the present invention to provide a higher capacitance for each DRAM cell.

SUMMARY OF THE INVENTION

This and other objects are achieved by the present invention which provides a dual photo-resist process for fabricating the poly layer plates of the DRAM cell capacitor connected to the drain of a DRAM MOSFET. A capacitor layer is formed on a semiconductor IC surface. A first plurality of photo-resist regions which are separated from each other by spaces are then formed on the capacitor plate layer. At least one second photo-resist region is then formed on the capacitor plate layer which partially fills a space between, and is adjacent to one of, two of the first photo-resist regions. The capacitor plate layer is then etched below the spaces between the first and second photo-resist regions to form a plurality of individual capacitor plates. The individual capacitor plates are separated by a space which can be less than the photo-lithographic resolution of the fabrication process thereby increasing the amount of charge which can be stored in each corresponding capacitor (or enabling a more dense packing of capacitors for a given capacitance).

DETAILED DESCRIPTION OF THE INVENTION

Figure 1:
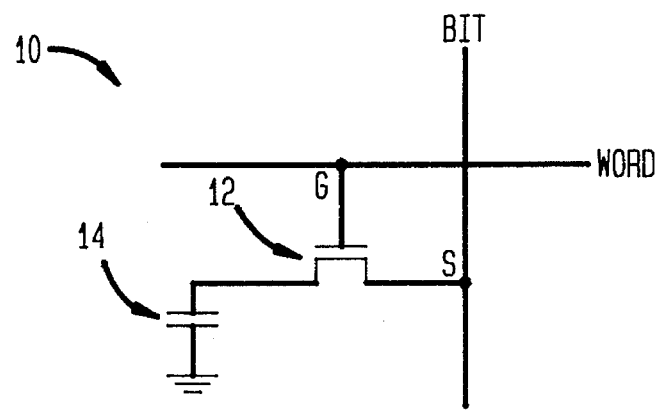
FIG. 1 schematically shows a DRAM cell circuit diagram.
Figure 2A:
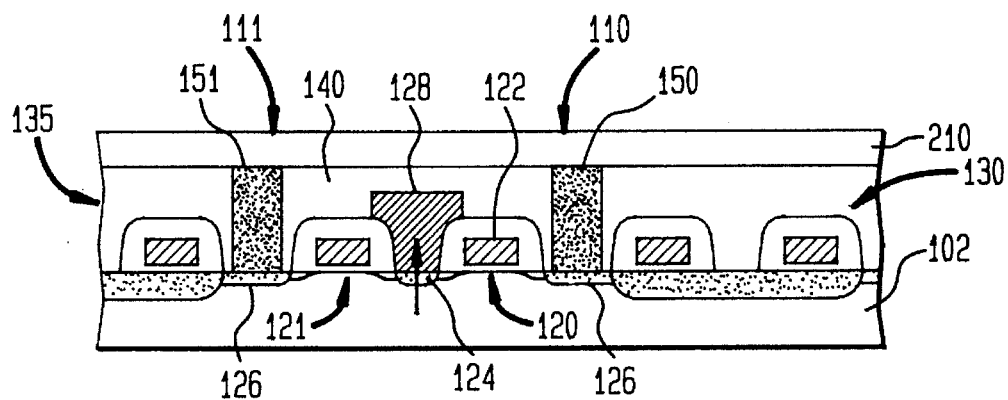
FIG. 2 illustrates a capacitor plate fabrication process according to one embodiment of the present invention.
Figure 2B:
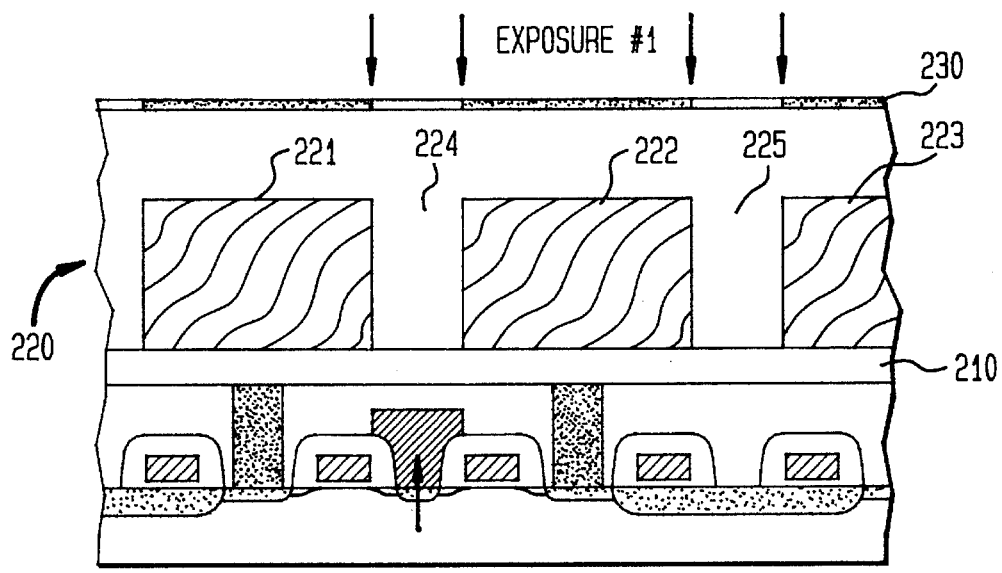
Figure 2C:
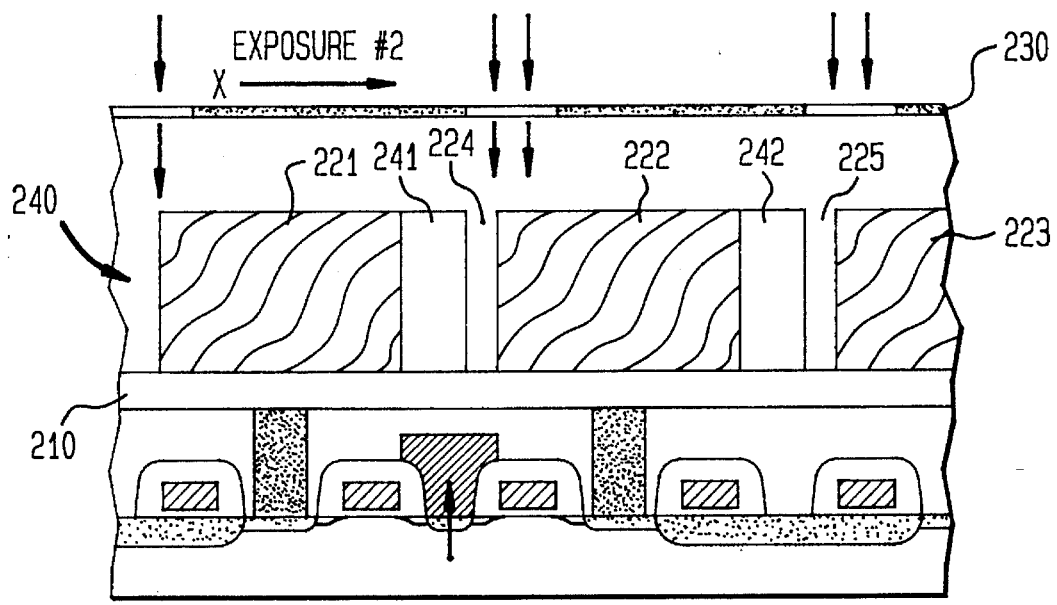
Figure 2D:
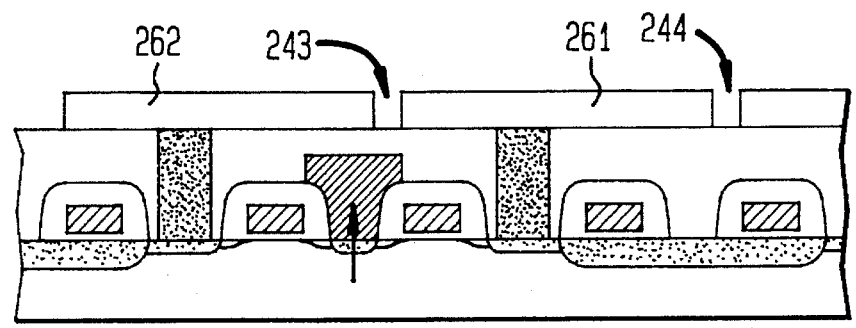
Figure 2E:
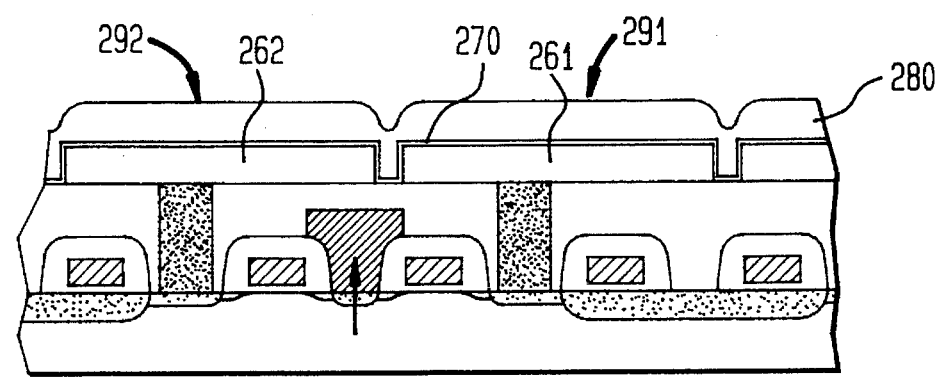

FIG. 2 illustrates a process for forming capacitors according to the present invention. As shown in step (a), a plurality of DRAM cells 110 and 111 are initially formed on a substrate. Each DRAM cell, e.g., the DRAM cell 110 includes a MOSFET 120. The MOSFET 120 includes a source 124 and drain 126 formed in the substrate 102 (e.g., by diffusion or implantation). A gate 122 is then formed from a first polycrystalline silicon (poly) I layer. The gate 122 is connected to a corresponding word line for that DRAM cell 110. The corresponding bit line is connected by a region 128 (which region 128 is formed from a poly II layer) to the source of the MOSFET 120. The MOSFETS 120 and 121 are then isolated in pairs by isolation regions 130 and 135. An insulating layer 140 is formed on the MOSFETS 120 and 121 and the isolation regions 130 and 135. Conducting vias 150 and 151 are provided in the insulating layer 140. Each via 150 and 151 extends through the entire thickness of the insulating layer 140 and is connected to a corresponding drain 126.

As show in step (a), a poly III layer 210 is formed on the insulating layer 140 surface and is connected to the drains 126 by the vias 150 and 151. In Step (b), a photo-resist layer 220 is formed on the poly III layer 210. The photo-resist layer 220 is patterned using a first mask 230 to form a number of photo-resist regions 221, 222, and 223 on the poly III layer 210. The photo-resist regions 221, 222, 223 are separated from each other by spaces 224 and 225. Advantageously, the photo-resist regions 221, 222 and 223 are formed as closely together as possible within the limits of the resolution of the particular photo-lithographic process (which may, for example, be an i-line stepper process; an i-line stepper currently can offer the best resolution of 0.5 um).

Afterward, a U-V baking step is performed to harden the first photo-resist. This must be done before adding a second photo-resist layer. The U-V baking step prevents further developing of the first photo-resist layer during subsequent exposures. Without the U-V baking step, the first photo-resist layer will be otherwise developed away.

In step (c), a second photo-resist layer 240 is formed on the poly III layer 210. The photo-resist layer 240 is patterned to form a second group of regions 241 and 242. Each of the photo-resist regions of the second group, e.g., the photo-resist region 241, is formed in a corresponding space 224 adjacent to one of the previously formed photo-resist regions of the first group, e.g., the photo-resist region 221. As a result, the spaces 224 and 225 are made narrower. This can easily be achieved using the same mask 230 as in the first exposures. The mask 230 is simply shifted slightly in a direction X parallel to the surface of the poly III layer 210 and a second exposure is performed.

In step (d), the exposed portions 243 and 244 of the poly III layer 210 not covered by a photo-resist region 221, 222, 223, 241 or 242 (i.e., the portions of the poly III layer 210 below the spaces 224 and 225) are etched. Thus, individual, separated capacitor plate regions 261 and 262 are formed. The photo-resist regions 221, 222, 223, 241 and 242 are then removed.

In step (e), a dielectric is formed on the individual capacitor plate regions 261 and 262. For example, an NO (nitride/oxide) layer 270 is deposited on the (surface and exposed side walls of) plate regions 261 and 262. Thereafter, a poly IV layer 280 is formed on the NO layer 270. The poly IV layer 280 serves as the second capacitor plate for each of the capacitors 291 and 292 formed according to the above process. After step (e) other conventional "back-end" or completion processes such as providing contact/metal, bonding wires, packaging, etc., may be performed.

The above process uses two dual photo-resist steps to provide narrow spaces separating each photo-resist region. Thus, it is possible to provide exposed portions of the capacitor plate layer (poly III layer 210) which are smaller than would be ordinarily possible for the given photolithographic resolution of the fabrication process. As stated above, this can be easily achieved by simply using the same mask 230 used to form the first plurality of photo-resist regions 221, 222, 223. That is, after forming the regions 221, 222, 223, the mask 230 is shifted in a direction X parallel to the surface of the poly III layer 210 and then used in a second exposure to form the regions 241 and 242. Alternatively, two separate masks could be mused, i.e., a different mask for each exposure. The second mask forms a similar pattern as the first mask except that the pattern formed by the second mask is shifted in the direction X with respect to the pattern formed by the first mask.

In short, a dual photo-resist process is disclosed for fabricating a DRAM cell capacitor. A first plurality of photo-resist regions which are separated from each other by spaces are then formed on a capacitor plate layer. At least one second photo-resist region is then formed which partially fills one of the spaces between, and which is adjacent to one of, two of the first photo-resist regions. The capacitor plate layer is then etched below the spaces between the first and second photo-resist regions to form a plurality of individual capacitor plates.

Finally, the above discussion is intended to be merely illustrative. Those having ordinary skill in the art may devise numerous other embodiments without departing from the spirit and scope of the following claims.

We claim:

1. A process for fabricating a DRAM cell capacitor comprising the steps of:
    forming a capacitor plate layer on a semiconductor surface;
    using a first mask, forming a first photo-resist layer on the capacitor plate layer;
    patterning the first photo-resist layer to define a plurality of first photo-resist regions on said capacitor plate layer, the photo-resist regions being separated from each other by spaces which expose the capacitor layer;
    after patterning the first photo-resist layer, forming a second photo-resist layer on the capacitor plate layer;
    shifting the mask in a direction parallel to a surface of the capacitor plate layer and toward a center of the spaces;
    using the shifted mask, patterning the second photo-resist layer to define a plurality of second photo-resist regions which partially fill said spaces; and
    etching said capacitor plate layer at said spaces to form a capacitor plate region.

2. The process of claim 1 further comprising the steps of:
    after the step of etching depositing a dielectric layer on said etched capacitor plate layer and side walls of said capacitor plate region, and
    forming a second capacitor plate layer on said deposited dielectric layer.

3. The process of claim 1 wherein said semiconductor surface is an insulating layer covering a DRAM cell MOSFET, said process further comprising before the step of forming the capacitor plate layer, forming a conducting via between a drain of said MOSFET and said surface on which said capacitor plate layer is formed.

4. The process of claim 1, wherein the steps of patterning include forming the mask using an i-line stepper photolithographic process.

5. The process of claim 1, further comprising after the step of patterning the first photoresist regions, baking the first photoresist region with ultraviolet light.

6. A process for fabricating a DRAM comprising the steps of:
    forming a plurality of MOSFETs each having a drain;
    forming an insulating layer on said MOSFETs;
    forming a plurality of vias in said insulating layer, each via connecting the drain of one of the plurality of MOSFETs and a surface of said insulating layer;
    forming a capacitor plate layer on said insulating layer surface, said capacitor plate layer being connected to each of said vias;
    forming a first photo,resist layer on the capacitor plate layer;
    using a mask, patterning the first photo-resist layer to define a first plurality of photo-resist regions on said capacitor plate layer which regions are separated from each other by spaces which expose the capacitor plate layer;
    forming a second photo-resist layer on the capacitor plate layer;
    shifting the mask in a direction parallel to a surface of the capacitor plate layer and toward a center of the spaces;
    patterning the second photo-resist layer to define second photo-resist regions which partially fill said spaces; and
    after the step of patterning the second photo-resist layer, etching said capacitor plate layer exposed by said spaces to form a plurality of individual capacitor plate regions.

7. The process of claim 6 wherein before the step of forming the insulation layer, forming isolation regions for isolating said DRAM cells.

8. The process of claim 6, wherein the steps of patterning include forming the mask using an i-line stepper photolithographic process.

* * * * *